United States Patent [19]

Iwade

[11] Patent Number: 4,903,118
[45] Date of Patent: Feb. 20, 1990

[54] SEMICONDUCTOR DEVICE INCLUDING A RESILIENT BONDING RESIN

[75] Inventor: Shuhei Iwade, Itami City, Japan

[73] Assignee: Director General, Agency of Industrial Science and Technology, Japan

[21] Appl. No.: 175,181

[22] Filed: Mar. 30, 1988

[51] Int. Cl.$^4$ ................... H01L 21/58; H01L 21/78
[52] U.S. Cl. ........................... 357/72; 357/68
[58] Field of Search ................. 357/70, 72, 68

[56] References Cited

U.S. PATENT DOCUMENTS

| 4,092,487 | 5/1978 | Imai | 357/72 |
| 4,190,855 | 2/1980 | Inoue | 357/72 |
| 4,210,704 | 7/1980 | Chandross et al. | 357/72 |
| 4,472,730 | 9/1984 | Ohta | 357/72 |
| 4,558,510 | 12/1985 | Tani et al. | 357/72 |
| 4,617,584 | 10/1986 | Ikeya et al. | 357/72 |
| 4,732,944 | 3/1988 | Smith, Jr. | 525/329.9 |
| 4,784,872 | 11/1988 | Moeller et al. | 437/225 |

FOREIGN PATENT DOCUMENTS

| 57-204138 | 12/1982 | Japan . | |
| 59-208735 | 11/1984 | Japan . | |
| 62-69640 | 3/1987 | Japan . | |
| 0136865 | 6/1987 | Japan | 357/81 |

OTHER PUBLICATIONS

J. Kimball, "Epoxy Device Bonding and Die Handling Techniques for Hubrid Microcircuits", Solid State Technology, Oct. 1973 pp. 55-58.
Bolger et al., "Die Attach in Hi-Rel . . . Epoxies?", IEEE Proceedings of Electronic Components Conference, 1984, p. 63.
Bolger et al., "Failure Mechanisms for . . . Encapsulated I.C's", IEEE Proceedings of Electronic Components Conference, 1983, p. 227.

Primary Examiner—Andrew J. James
Assistant Examiner—Viet Nguyen
Attorney, Agent, or Firm—Leydig, Voit & Mayer

[57] ABSTRACT

A semiconductor device comprising a semiconductor chip attached to a substrate by two kinds of bonding agents, one of which is rigid and disposed at the central region of the semiconductor chip, the other of which is disposed around the rigid bonding agent and which is sufficiently resilient to accommodate thermal expansion differences between the semiconductor chip and the substrate.

5 Claims, 1 Drawing Sheet

SEMICONDUCTOR DEVICE INCLUDING A RESILIENT BONDING RESIN

BACKGROUND OF THE INVENTION

This invention relates to a semiconductor device and more particularly, to a semiconductor device in which a semiconductor chip is bonded to a substrate.

PRIOR ART

FIG. 1 illustrates, in cross section, a conventional semiconductor device 1 of the type to which the present invention is applicable. The semiconductor device 1 comprises a semiconductor chip 2, a substrate 3 for supporting the semiconductor chip 2, and a bonding layer 4 of a bonding agent disposed between the semiconductor chip 2 and the substrate 3 for bonding the semiconductor chip on the substrate 3. The semiconductor chip 2 is bonded to the substrate 3 by first applying the bonding layer 4 of the bonding agent over the entire surface of the substrate on which the semiconductor chip 2 is to be attached. Then, the semiconductor chip 2 is placed on the bonding agent layer 4. Thus, a bonded interface 5 is formed between the semiconductor chip 2 and the bonding agent layer 4, and another bonded interface 6 is formed between the bonding agent layer 4 and the substrate 3. The bonding agent usually used for this purpose includes epoxy resins, which are hard and rigid bonding agents exhibiting a strong bond in order to ensure that the semiconductor chip 2 is not moved relative to the substrate by external forces or vibrations.

When the semiconductor device 1 is in operation or when the environmental temperature is increased, the semiconductor device 1 is heated and thermally expands. However, since the coefficients of the thermal expansion of the semiconductor chip 2 and the substrate 3 are different, a lateral stress is generated at the bonded interfaces 5 and 6 of the semiconductor chip 2 and the substrate 3. This often causes the separation of the semiconductor chip 2 from the substrate at the bonded surfaces 5 and 6. This separation is aggravated when the semiconductor device 1 is repeatedly heated. Since the stress at the interfaces 5 and 6 due to the thermal expansion is greater in the peripheral portion of the bonded surfaces than in the central portion, separation at the interfaces 5 and 6 appears more readily at the peripheral portion of the interfaces 5 and 6 then at the central portion.

Once separation occurs, moisture can easily enter into the interfaces 5 and 6 to promote the water dissolution of the bonding agent 4 accelerating further growth in the separation and often resulting in a complete separation of the semiconductor chip 2 from the substrate 3.

When a soft bonding agent, which usually has a relatively weak bonding ability, is used for the bonding agent 4 in order to cope with the above-discussed problem of the differences in thermal expansion, the bonded interfaces are easily influenced by external vibrations and forces, resulting in the positional displacement and separation of the semiconductor chip with respect to the substrate. This is particularly true with elongated semiconductor chips, such as those used in linear image sensors.

SUMMARY OF THE INVENTION

Accordingly, an object of the present invention is to provide a semiconductor device in which the separation of the semiconductor chip from the substrate at the bonded interface is eliminated.

Another object of the present invention is to provide a semiconductor device in which the difference in thermal expansion between the semiconductor chip and the substrate is efficiently accommodated.

Still another object of the present invention is to provide a semiconductor device in which the semiconductor chip is firmly and reliably bonded.

With the above objects in view, the semiconductor device of the present invention comprises a semiconductor chip, a substrate for supporting the semiconductor chip, and a bonding layer, disposed between the semiconductor chip and the substrate, for bonding the semiconductor chip on the substrate. The bonding layer comprises a rigid layer of a substantially rigid bonding agent at the central region of the bonding layer, and a resilient layer of a substantially soft bonding agent disposed around the rigid layer, the resilient bonding agent having sufficient resilience for accommodating thermal expansion differences between the semiconductor chip and the substrate. The rigid bonding agent may be an epoxy resin, and the resilient bonding agent may be a urethane resin. The rigid bonding agent may have a Young's modulus of about 919 kg/mm$^2$ and the resilient bonding agent a Young's modulus of about 280 kg/mm$^2$.

According to the present invention, large stress appearing at the peripheral portion or the semiconductor device due to the thermal expansion is accommodated by the resilient bonding agent disposed peripherally around the rigid bonding agent.

BRIEF DESCRIPTION OF THE DRAWINGS

The present invention will become more readily apparent from the following detailed description of the preferred embodiment of the present invention shown by way of example in the accompanying drawings, in which.

DESCRIPTION OF THE PREFERRED EMBODIMENT

Figure 1:
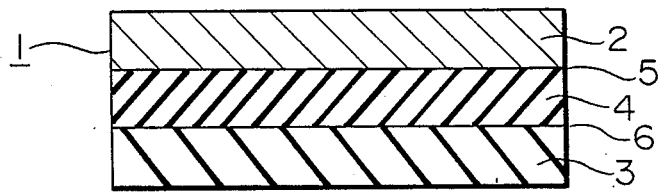
FIG. 1 is a sectional view showing a conventional semiconductor device in which the semiconductor chip is bonded to the substrate.
Figure 2:
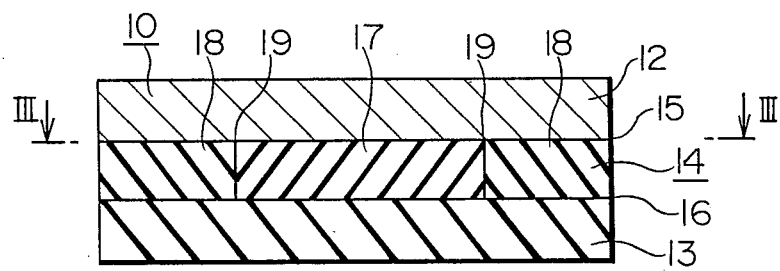
FIG. 2 is a sectional view taken along line II—II of FIG. 3 showing a semiconductor device of the present invention in which the semiconductor chip is bonded to the substrate by two kinds of bonding agents.
Figure 3:
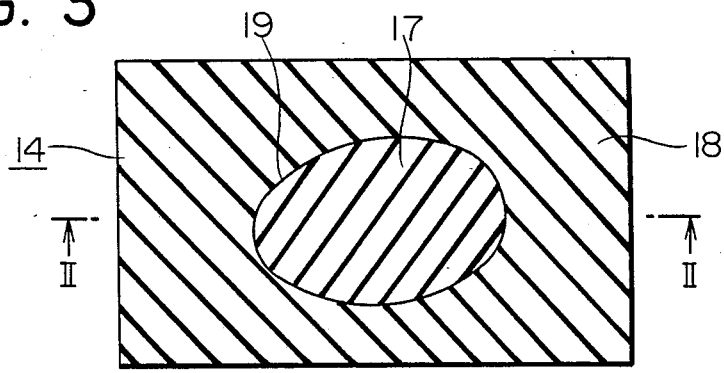
FIG. 3 is a sectional view taken along line III—III of FIG. 2 showing a bonding agent of the semiconductor device.

FIGS. 2 and 3 illustrate, in cross sectional, a semiconductor device 10 constructed in accordance with the present invention. The semiconductor device 10 comprises a semiconductor chip 12, a substrate 13 for supporting the semiconductor chip 12, and a bonding layer 14 disposed between the semiconductor chip 12 on the substrate 13 for securely bonding the semiconductor chip on the substrate 13. The semiconductor chip 12 is bonded to the substrate 13 by first applying the bonding layer 14 over the entire surface of the substrate on which the semiconductor chip 12 is to be attached. Then, the semiconductor chip 12 is placed on the bonding layer 14. Thus, a bonded interface 15 is formed between the semiconductor chip 12 and the bonding layer 14, and another bonded interface 16 is formed between the bonding agent layer 14 and the substrate 13.

According to the present invention, the bonding layer 14 comprises a rigid layer 17 of a substantially rigid or less resilient bonding agent disposed at the central region of the bonding layer 14, and a resilient layer 18 of a substantially resilient bonding agent disposed around the rigid layer 17. A circular boundary 19 is formed between the rigid layer 17 and the resilient layer 18. The resilient bonding agent should have sufficient resilience to accommodate the differences in thermal expansion between the semiconductor chip 12 and the substrate 13. Typically, the rigid bonding agent for the rigid layer 17 is an epoxy resin, and the resilient layer 18 for the resilient bonding agent is a urethane resin. Preferably, the rigid bonding agent has a Young's modulus of about 919 kg/mm$^2$ and the resilient bonding agent has a Young's modulus of about 280 kg/mm$^2$.

Thus, the hard and rigid layer 17 of a rigid bonding agent disposed at the central portion of the bonding agent layer 14 exhibits a strong and rigid bond between the semiconductor chip 12 and the substrate 13 to ensure that the semiconductor chip 12 does not move relative to the substrate 13 even when an external force or vibration is applied. On the contrary, the soft and resilient layer 18 of a resilient bonding agent disposed at the peripheral portion of the bonding agent layer 14 exhibits a relatively storing but resilient bond between the semiconductor chip 12 and the substrate 13 to ensure that the peripheral portion of the semiconductor chip 12 can slightly move relative to the substrate 13 to accommodate the differences in thermal expansion between the chip 12 and the substrate 13 while still maintaining a firm bond therebetween.

When the semiconductor device 10 is in operation or the environmental temperature is increased to heat and thermally expand the semiconductor device 10, the semiconductor chip 12 and the substrate 13 expand by amounts different from one another since the coefficients of thermal expansion of the semiconductor chip 12 and the substrate 13 are different. However, substantially no lateral stress due to this thermal expansion difference is generated at the bonded interfaces 15 and 16 of the semiconductor chip 12 and the substrate 13 because the resilient bonding agent layer 18 accommodates or absorbs the differences in thermal expansion between the semiconductor chip 12 and the substrate 13. Therefore no separation of the semiconductor chip 12 from the substrate 13 at the bonded surfaces 15 and 16 is generated.

Since no separation is produced, it is difficult for moisture to enter into the interfaces 15 and 16, so that water dissolution of the bonding agent layer 14 is prevented from promoting the further growth of the separation.

While the present invention has been described in conjunction with a single embodiment in which only two kinds of bonding agent layers are used, three or more bonding agent layers can equally be used. This arrangement is preferable when a sudden change in the bonding strength between the semiconductor chip and the substrate is not desirable.

As has been described, according to the semiconductor device of the present invention, a semiconductor chip is attached to a substrate by two kinds of bonding agents, one of which is rigid and disposed at the central region of the semiconductor chip, the other of which is disposed around the rigid bonding agent and is sufficiently resilient to accommodate thermal expansion difference between the semiconductor chip and the substrate. Therefore, the problem of the separation of the semiconductor chip from the substrate at the bonded interface is eliminated, the differences in thermal expansion between the semiconductor chip and the substrate are efficiently accommodated, and the semiconductor chip is firmly and reliably bonded to the substrate.

What is claimed is:

1. A semiconductor device comprising a semiconductor chip, a substrate for supporting said semiconductor chip, and bonding means disposed between said semiconductor chip and said substrate for bonding said semiconductor chip onto said substrate for bonding said semiconductor chip onto said substrate, said bonding means comprising a relatively rigid bonding resin disposed between and contacting said semiconductor chip and substrate and a relatively resilient bonding resin disposed between and contacting said semiconductor chip and substrate and enclosing said relatively rigid resin whereby differences in thermal expansion between said semiconductor chip and said substrate are accommodated.

2. A semiconductor device as claimed in claim 1 wherein said relatively rigid bonding resin is an epoxy resin and said relatively resilient bonding resin is a urethane resin.

3. A semiconductor device as claimed in claim 1 wherein said relatively rigid bonding resin has a Young's modulus of about 920 kg/mm$^2$ and said relatively resilient bonding resin has a Young's modulus of 280 kg/mm$^2$.

4. A semiconductor device as claimed in claim 1 wherein said bonding means comprises a third bonding resin disposed between and contacting said semiconductor chip, said substrate, said relatively rigid resin, and said relatively resilient resin, said third resin having a resilience intermediate the resiliencies of said relatively rigid resin and said relatively resilient resin.

5. A semiconductor device as claimed in claim 1 wherein said relatively rigid and relatively resilient resins are electrically insulating.

* * * * *

UNITED STATES PATENT AND TRADEMARK OFFICE
CERTIFICATE OF CORRECTION

PATENT NO. : 4,903,118

DATED : February 20, 1990

INVENTOR(S) : Shuhei Iwade

It is certified that error appears in the above-identified patent and that said Letters Patent is hereby corrected as shown below:

Column 4, lines 28-29, delete "for bonding said semiconductor chip onto said substrate".

Signed and Sealed this

Twenty-sixth Day of March, 1991

Attest:

HARRY F. MANBECK, JR.

*Attesting Officer*  *Commissioner of Patents and Trademarks*